July 31, 1962 I. HAAS 3,047,819
SOLID-STATE PULSE GENERATOR
Filed Aug. 11, 1959

INVENTOR.
ISY HAAS
BY
ATTORNEY 3,047,819
Patented July 31, 1962

3,047,819

SOLID-STATE PULSE GENERATOR

Isy Haas, Menlo Park, Calif., assignor to Sperry Rand Corporation, New York, N.Y., a corporation of Delaware Filed Aug. 11, 1959, Ser. No. 833,030
6 Claims. (Cl. 331—107)

This invention relates to a pulse generating circuit, and is more particularly concerned with a pulse generator utilizing positive-gap diodes as the active components.

Many electronic circuits utilize sharp pulses of current or voltage as a basic part of their operation. Such pulses must frequently be of very short time duration and accurately spaced in time. The various types of circuits for generating these pulses are termed pulse generators.

Pulse generators utilizing vacuum tubes, magnetic amplifiers, and other solid-state devices as the active components thereof are known in the field. In this invention there is disclosed a pulse generator in which the active components are positive-gap diodes.

Positive-gap diodes are, at present, known to have fast rise-times, viz. as low as 2 millimicroseconds. It has been found that by using positive-gap diodes as switching components in pulse-generating circuits, pulses having fast-rise times and high pulse-repetition-rates may be provided, which are suitable for use, for example, in electronic computer applications. Corresponding fast computation times may, thereby, be made available.

An object of this invention is to provide a new and improved pulse-generator.

Another object of this invention is to provide a generator for producing pulses having extremely fast-rise times.

Another object of the invention is to provide a pulse generator having a small number of switching elements.

A further object of the invention is to provide a pulse generating circuit which generates pulses at high pulse-repetition-rates.

A still further object is to provide a pulse generating circuit requiring low input power.

Another object of the invention is to provide improved pulse-forming circuits for use in high-speed computers and with simple circuitry and components having fast-rise times.

Still another object of the invention is to provide a pulse generator wherein the pulse width and the repetition rate may be varied.

The present invention utilizes positive-gap diodes such as are described in "Electrical Communication," June 1955, pages 113 to 117. These positive-gap diodes exhibit two distinct operating states, and a negtive resistance characteristic. The two operating states correspond to "low" and "high" current-conducting states, respectively.

In accordance with this invention a first positive-gap diode is included in one of the paths for charging and discharging an energy storage means. This one path also includes means responsive to the conductive state of the first diode for controlling the conductive state of a second such diode and, thereby, for controlling the energization of an output circuit. The foregoing and other objects and features of the invention will be obvious when the following specification is read in conjunction with the drawings in which.

Figure 1:
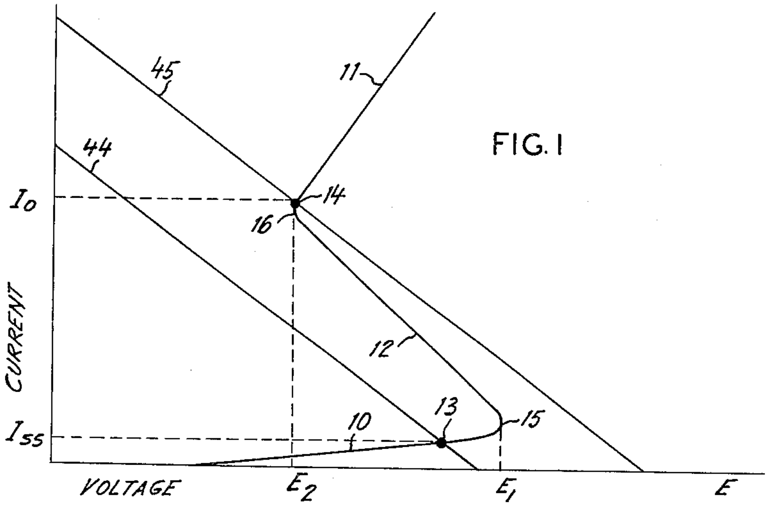
FIGURE 1, is an idealized graph of the voltage-current characteristics of a positive-gap diode.

In FIGURE 1, a stable quiescent or "low-current-conducting" state of a positive-gap diode is graphically illustrated generally at 10. A stable energized or "high-current-conducting" state is indicated generally at 11. A region of negative resistance which introduces a discontinuous or unstable condition into the operation of the positive-gap diode is graphically illustrated generally at 12.

The potential difference between the anode and the cathode elements of a positive-gap diode will determine the state of operation of the diode. That is, if the aforementioned potential difference is large, the diode will operate in the high conducting or energized region. Conversely, if the potential difference is small, the diode will operate in its low-conducting or quiescent state. For example, if the diode is assumed to be in the quiescent state when, in effect, a positive-going voltage of sufficient amplitude is applied to its anode, the diode will be switched or triggered to the energized state. That is, the potential difference has been increased and, therefore, the operating state has been changed. The diode may be reset or switched from the energized state to the quiescent state by decreasing the potential difference. This may be accomplished by lowering the anode potential or by raising the cathode potential.

It may be readily appreciated that when in the quiescent state, the positive-gap diode permits a current of only negligible magnitude. However, when the diode is switched to the energized state, the current therethrough is quite sizeable. Thus, it may be seen that, in addition to having extremely rapid switching from "high" to "low" conducting states, the positive-gap diode also acts as an amplifier. The amplification of the diode may be calculated by means of the formula:

$$A=\frac{(I_o-I_{ss})}{V}\cdot R_L$$

where $R_L$ is the load resistance, $I_o$ and $I_{ss}$ are the currents obtained when the diode is at the high and low-conducting states, respectively, and V is, for instance, the positive going signal applied to the anode of the diode.

Figure 2:
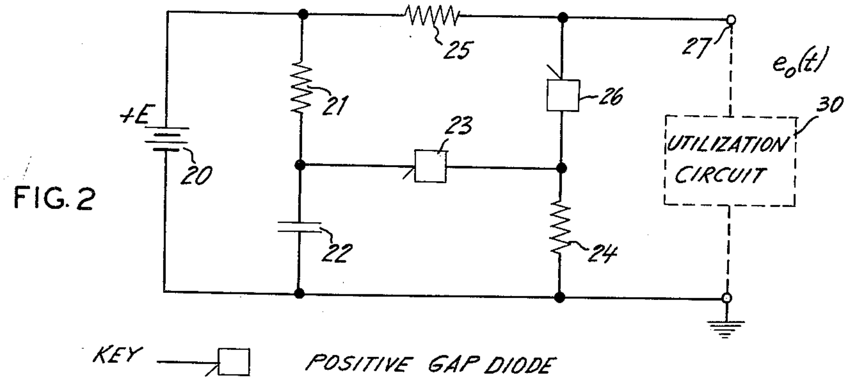
FIGURE 2, is a schematic circuit diagram of an embodiment of the invention; and, FIGURE 3, illustrates graphically the waveform of the output voltage as a function of time.

The circuit of FIGURE 2, may be conveniently considered as composed of two basic networks which are interdependent. The first of these basic networks which will be considered comprises a voltage source 20, for example, a battery of potential E, a resistor 21, a capacitor 22, a positive-gap diode 23, and a resistor 24. Resistor 21 is connected at one of its ends to the positive terminal of battery 20, the negative terminal of which is at ground. Resistor 21 is connected at its other end to one terminal of capacitor 22 which is in turn connected at its other terminal to ground. The anode of positive-gap diode 23 is also connected to the junction of resistor 21 and capacitor 22. The cathode of diode 23 is returned to ground via bias resistor 24.

The second network comprises the battery 20, a resistor 25, a positive-gap diode 26, and the bias resistor 24 connected in that order in a series circuit. Connected in parallel with the series combination of resistor 21 and diode 23 is the series combination of resistor 25 and positive-gap diode 26; that is, one end of resistor 24 is connected to the junction of battery 20 and limiting resistor 21 and the cathode of diode 26 is joined to the junction of diode 23 and bias resistor 24. At the junction of the anode of diode 26 and the other end of resistor 25 is an output terminal 27. A utilization circuit 30 (such as a computer circuit) is connected between the output terminal 27 and ground.

The network comprising battery 20, limiting resistor 21, capacitor 22, positive-gap diode 23, and bias resistor 24 will operate as a sawtooth generator. For this type of operation, viz. monostable operation, limiting resistor 21 is selected so that it will, in conjunction with bias resistor 24, the selection of which will be further discussed subsequently, define a load-line having a slope such that the load-line will intersect the characteristic curve of diode 23 in one or the other of the regions 10 and 12 (at only one point for a particular voltage). The region of intersection, for certain initial conditions for the diode 23, may be considered to be that of the low-current-conducting or quiescent state 10. That is, the characteristic curve of diode 23, and the load-line 44 will intersect in the region 10 as shown in FIGURE 1. This intersection (for example, point 13 for a particular applied voltage) will then determine the operating point of diode 23 at that voltage.

Assuming the initial conditions of the network to be such that diode 23 is in the low or quiescent state of region 10, capacitor 22 has little or no charge stored thereon. Whereupon, when the voltage E is applied to the network by battery 20, the voltage across the capacitor cannot change instantaneously, but rises exponentially as charge is stored on the capacitor according to the well known exponential equation. As the voltage across the capacitor rises exponentially, the voltage across diode 23 and the current through it follow the characteristic curve of the diode along region 10. When the voltage across the diode 23 reaches $E_1$ corresponding the "knee" 15 in the curve the diode will rapidly switch through the negative resistance or discontinuous region, shown generally at 12 in FIGURE 1, to the high-current-conducting or energized state shown generally at region 11. A new operating point 14 in the energized region is located at the intersection of the characteristic curve of diode 23 and the new load-line 45. Load-line 45 has the same slope as load-line 44. When the diode 23 shifts to the energized state, a large current flows through bias resistor 24. A large voltage is, therefore, dropped across resistor 24, whereby the potential at the cathode of diode 23 is raised. A result of this phenomenon will be discussed subsequently.

As the current flows through diode 23, capacitor 22 discharges exponentially through the diode. When the voltage across the diode drops to a sufficiently small value, for example $E_2$, indicated at a second "knee" 16 in the curve, the diode shifts back to its quiescent operating point 13. This type of operation is repetitive, thereby describing typical sawtooth generator action.

In this invention, a network comprising resistor 25 and diode 26 connected in series is connected in parallel with the series connected combination comprising resistor 21 and diode 23. As in the case of load-lines 44 and 45, the load-lines of diode 26 are determined by the proper selection of resistor 25 in conjunction with bias resistor 24. The slope of these load-lines may be similar to the slope of load-lines 44 and 45. However, this is not necessarily the case; but for simplicity of illustration, the operating characteristics shown in FIGURE 1 will also be applied to diode 26.

The diode 26 may be considered to be normally biased to the high-conducting state, by the application of a potential of substantially E magnitude, by means of resistors 24 and 25. A decrease in the difference in potential between the anode and cathode thereof causes the diode 26 to switch to its low-conducting state. This may be accomplished by decreasing the potential at the anode, or by increasing the potential at the cathode of the diode 26. The latter method will be utilized to switch the diode as subsequently described.

In accordance with the invention, the previously separately described networks are connected so as to be interdependent. That is, the switching of diode 26 is dependent upon the operation of diode 23, or more particularly, the state (high or low-current state) of diode 23 will determine the state of diode 26. To illustrate this phenomenon, a description of the operation of the entire circuit, as shown in FIGURE 2, is now described.

Initially, the capacitor 22 may be assumed to be discharged; when the battery voltage E is applied to the circuit, there is substantially no voltage across diode 23 and a large voltage across diode 26. Thus, diode 23 is in the quiescent state 10 and diode 26 is in the energized state 11 when the voltage E is applied to the circuit. When capacitor 22 has charged sufficiently, the value of the threshold voltage necessary to switch diode 23 to its energized state 11 appears across the diode 23. Thus, diode 23 shifts to an operating point, for example 14, in the high-conducting state 11. A relatively large current then flows through bias resistor 24. This relatively large current will cause a similarly relatively large potential drop across resistor 24. The potential drop across resistor 24 will appear as an increase in potential at the cathode of diode 26. The difference in potential between the anode and the cathode of diode 26 will decrease by a predetermined value which is sufficient to cause the operating point of diode 26 to shift along the characteristic curve until it reaches the "knee" 16, whereupon the diode switches from its high to its low-conducting state. Thus, diode 23 is now conducting heavily and diode 26 is substantially cut-off. The magnitude of the output signal at terminal 27, which had previously been small with respect to ground now becomes relatively large.

The diodes will continue to operate at the new operating points until the capacitor 22 is discharged so that the potential across diode 23 falls below the threshold value $E_2$, and diode 23 switches back to an operating point 13 in the low-current conducting state 10. The current through bias resistor 24 will then drop to a substantially negligible current, and since the relatively large potential, which was dependent upon a large current flowing through resistor 24, is removed from its cathode, the potential across the diode 26 will again become large and diode 26 will revert to an operating point 14 in the high-conducting region 11. The voltage at the output terminal 27 then falls to a low value.

Figure 3:
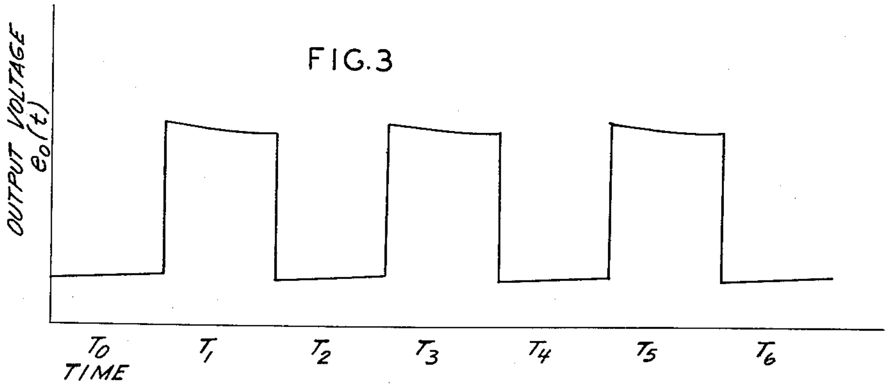

FIGURE 3 shows a graphic illustration of the waveshape of the output voltage as a function of time. During the time periods $T_0$, $T_2$, and $T_4$, for example, the amplitude of the output voltage at output terminal 27 is relatively small. The small amplitude pulses are present when diode 26 is in the energized state 11 or "on." During the time periods $T_1$, $T_3$ and $T_5$, for example, the amplitude of the output voltage at output terminal 27 is relatively large. The large amplitude voltage is present when diode 26 is in the quiescent state 10, or "off." The leading and trailing edges of the pulses are very steep due to the fast response characteristics of these diodes and due to the circuit arrangement of diode 26 controlling the output voltage.

As previously described, the "on" or energized state of diode 26 corresponds to the "off" or quiescent state of diode 23 and vice versa. Therefore, the value of $e_0(t)$, the output voltage obtained at terminal 27, decays exponentially when diode 23 is "on" because the capacitor discharge current flowing through bias resistor 24 decays exponentially. This decrease in current will, of course, cause a decreasing potential drop across resistor 24, and, therefore, the positive potential applied to the cathode of diode 26 will decrease. As the potential at the cathode of diode 26 decreases, the voltage at the output terminal 27 also decreases somewhat. However, this voltage change as it appears at the output terminal 27 is substantially attenuated because of the very large impedance of the diode 26. The slope of the tops of the pulses in FIGURE 3 is exaggerated for illustration purposes. To a somewhat similar extent the output voltage between pulses varies reflecting the variation in capacitor voltage as it charges. This capacitor voltage variation is also substantially attenuated as it appears at the output terminal due to the large impedance of diode 23 which is then in the low-conducting state.

To make the tops of the output pulses substantially flat, it may be desirable to alter the width of the pulse. This is accomplished by controlling the pulse duration via the time constants of the circuit. The pulse duration is determined by the formula:

$$R_tC$$

where C represents the value of capacitor 22, and $R_t$ represents the total series resistance of the discharge network which includes bias resistor 24 and the internal resistance of diode 23 when operating in region 11. It should be noted that the internal resistance of positive-gap diodes in region 11 is much smaller than in region 10.

The pulse repetition rate may also be varied by altering the time constant of the circuit which is controlled by the parameters of the circuit. The pulse repetition rate may be determined by the formula:

$$\frac{(R_sR_L)C}{R_s+R_L}$$

where C again represents the value of capacitor 22, $R_s$ represents the total series resistance of biasing resistor 24 and the diode resistance in region 10, and $R_L$ represents the limiting resistance 21.

The charging of the capacitor 22 via resistor 21 is not interrupted so that the circuit is freely running. Synchronizing pulses may also be supplied to the capacitor 22 in the usual manner where such operation is desired.

While the present invention has been described with reference to a particular embodiment thereof, it will be understood that modifications may be made by those skilled in the art without actually departing from this invention. It must, therefore, be emphasized that the foregoing description is meant to be illustrative only and should not be considered limitative of the invention. All variations and modifications, as are in accord with the principles herein described, are meant to fall within the scope of the appended claims.

Having thus described the invention, what is claimed is:

1. A pulse generator circuit comprising a voltage source, first and second resistors each having one terminal connected to a first terminal of said source, first and second positive-gap diodes each having a first element connected to another terminal of the respective resistors, a third resistor having one terminal thereof connected to both of the second elements of said diodes, said third resistor having another terminal connected to a second terminal of said source, and a capacitor having one terminal connected to said second terminal of said source, said capacitor having another terminal connected to one of said first elements of said diodes.

2. A pulse generator circuit comprising a unidirectional voltage source, first and second resistors each having one terminal connected to a positive terminal of said source, first and second positive-gap diodes, the anode of said first diode being connected to another terminal of said first resistor, the anode of said second diode being connected to another terminal of said second resistor, a third resistor having one terminal connected to both of the cathodes of said first and second diodes, another terminal of said third resistor connected to a negative terminal of said source, a capacitor having one terminal connected to the anode of said first diode and another terminal connected to said negative terminal of said source, and an output terminal connected to the anode of said second diode.

3. A pulse generator circuit comprising a D.C. voltage source, first and second resistors each having one terminal connected to a first terminal of said source, first and second positive-gap diodes characterized by high and low current conduction states, each of said diodes having a first element thereof connected to a second terminal of one of said resistors, a third resistor having one terminal thereof connected to the second element of both of said diodes, said third resistor having another terminal connected to a second terminal of said source, and a capacitor having one terminal connected to said second terminal of said source, said capacitor having another terminal connected to the first element of said second diode so that said capacitor can control the potential at said first element of said second diode and thereby control the current conducting state of said diodes.

4. A pulse generator circuit comprising a unidirectional voltage source, first and second different resistors each having a first terminal connected to a positive terminal of said source, a first positive-gap diode having the anode thereof connected to a second terminal of said first resistor, a second positive-gap diode having the anode thereof connected to a second terminal of said second resistor, a third resistor having a first terminal connected to the cathodes of each of said first and second diodes, said third resistor having a second terminal thereof connected to a negative terminal of said source, a capacitor having a first terminal connected to the anode of said first diode and a second terminal connected to said negative terminal of said source so that said capacitor can control the current conducting level of said diodes, and an output terminal connected to the anode of said second diode.

5. A pulse generator circuit comprising a D.C. voltage source, first and second resistors, each of said first and second resistors having one terminal connected to a first terminal of said source, first and second positive-gap diodes, said positive-gap diodes being characterized by high and low current conduction states, each of said diodes having a first element thereof connected to a second terminal of one of said resistors, a capacitor, said capacitor having one terminal connected to said second terminal of said source, said capacitor having another terminal connected to the first element of said second diode so that said capacitor can control the potential at said first element of said second diode and thereby control the current conducting state of said second diode, and a third resistor, said third resistor having one terminal thereof connected to the second element of both of said diodes, said third resistor having another terminal connected to a second terminal of said source so that current flowing through the diodes passes through said third resistor whereby said third resistor controls the current conducting state of said first diode.

6. A pulse generator circuit comprising a voltage source, a plurality of biasing resistors, each of said biasing resistors having one contactor connected to a first terminal of said voltage source, first and second positive-gap diodes, said positive-gap diodes being characterized by high and low current conduction states, each of said diodes having a first element thereof connected to a second contactor of different ones of said biasing resistors, energy storage means, said energy storage means having one tap connected to a second terminal of said voltage source, said storage means having another tap connected to the first element of said second diode so that said storage means can control the potential at said first element of said second diode in accordance with the energy stored in said storage means thereby to control the current conducting state of said second diode, and a control resistor, said control resistor having one contactor thereof connected to the second element of both of said diodes, said control resistor having another contactor connected to a second terminal of said voltage source so that current flowing through said second diode passes through said control resistor so that said control resistor determines the current conducting state of said first diode in accordance with the magnitude of the current passing therethrough.

References Cited in the file of this patent

UNITED STATES PATENTS

| | | |
|---|---|---|
| 2,260,906 | Hudec | Oct. 28, 1941 |

| | | |
|---|---|---|
| 2,581,273 | Miller | Jan. 1, 1952 |
| 2,735,011 | Dickinson | Feb. 14, 1956 |
| 2,777,956 | Kretzmer | Jan. 15, 1957 |
| 2,944,164 | Odell et al. | July 5, 1960 |

FOREIGN PATENTS

| | | |
|---|---|---|
| 159,041 | Australia | Sept. 27, 1954 |